(12) United States Patent
Lu

(10) Patent No.: US 12,437,713 B2
(45) Date of Patent: Oct. 7, 2025

(54) DISPLAY PANEL AND DISPLAY DEVICE ELIMINATING SPLIT-SCREEN PHENOMENON BETWEEN DISPLAY REGIONS WITH DIFFERENT LIGHT TRANSMITTANCE RATES

(71) Applicant: WUHAN CHINA STAR OPTOELECTRONICS SEMICONDUCTOR DISPLAY TECHNOLOGY CO., LTD., Wuhan (CN)

(72) Inventor: Kai Lu, Wuhan (CN)

( * ) Notice: Subject to any disclaimer, the term of this patent is extended or adjusted under 35 U.S.C. 154(b) by 0 days.

(21) Appl. No.: 17/615,116

(22) PCT Filed: Nov. 12, 2021

(86) PCT No.: PCT/CN2021/130380
§ 371 (c)(1),
(2) Date: Apr. 30, 2024

(87) PCT Pub. No.: WO2023/035402
PCT Pub. Date: Mar. 16, 2023

(65) Prior Publication Data
US 2024/0290257 A1   Aug. 29, 2024

(30) Foreign Application Priority Data
Sep. 7, 2021 (CN) .......................... 202111044278.5

(51) Int. Cl.
*G09G 3/3233* (2016.01)
*G09G 3/3266* (2016.01)

(52) U.S. Cl.
CPC ......... *G09G 3/3233* (2013.01); *G09G 3/3266* (2013.01); *G09G 2320/0233* (2013.01)

(58) Field of Classification Search
CPC .................................................. G09G 3/3233
See application file for complete search history.

(56) References Cited

U.S. PATENT DOCUMENTS

| 11,296,180 B2 * | 4/2022 | Kim ..................... G09G 3/3291 |
| 2019/0261512 A1 * | 8/2019 | Huang ................... H05K 1/115 |
| 2020/0176551 A1 * | 6/2020 | Park .................. H10K 59/1216 |

FOREIGN PATENT DOCUMENTS

| CN | 108206008 A | 6/2018 |
| CN | 110600531 | 12/2019 |

(Continued)

OTHER PUBLICATIONS

International Search Report in International application No. PCT/CN2021/130380, mailed on May 12, 2022.

(Continued)

*Primary Examiner* — Chun-Nan Lin

(57) ABSTRACT

A display panel and a display device are provided. The display panel includes a display substrate including a first display region and a second display region adjacent to the first display region, n rows of first pixel driving circuits located in the first display region and m rows of second pixel driving circuits located in the second display region, a plurality of reset signal lines including n first reset signal lines corresponding to the n rows of the first pixel driving circuits; wherein one terminal of each of the first reset signal lines is electrically connected to the corresponding first pixel driving circuits, and another terminal of one of any two adjacent first reset signal lines is electrically connected to the corresponding second pixel driving circuits. The display device includes the display panel.

20 Claims, 8 Drawing Sheets

(56) References Cited

FOREIGN PATENT DOCUMENTS

| | | |
|---|---|---|
| CN | 111462695 A | 7/2020 |
| CN | 111489681 | 8/2020 |
| CN | 111968576 | 11/2020 |
| CN | 112102783 | 12/2020 |
| CN | 113178140 | 7/2021 |
| CN | 113299201 | 8/2021 |
| KR | 20200066471 A | 6/2020 |

OTHER PUBLICATIONS

Written Opinion of the International Search Authority in International application No. PCT/CN2021/130380, mailed on May 12, 2022.

Chinese Office Action issued in corresponding Chinese Patent Application No. 202111044278.5 dated Jul. 6, 2022, pp. 1-5.

\* cited by examiner

DISPLAY PANEL AND DISPLAY DEVICE ELIMINATING SPLIT-SCREEN PHENOMENON BETWEEN DISPLAY REGIONS WITH DIFFERENT LIGHT TRANSMITTANCE RATES

FIELD OF INVENTION

The present invention relates to a field of display technology, and particularly to a display panel and a display device.

BACKGROUND OF INVENTION

With development of industry of portable electronic equipment (such as mobile phones, tablets, e-books, and navigation devices), because camera under panel (CUP) technology provides better visual enjoyment and interference-free full-scope display, it gradually becomes a trend of the development.

Current CUP display devices refer to display devices that display is allowed on a display panel corresponding to a camera position. When not taking pictures, the display panel can display screen content normally; when taking pictures, good light transmittance can meet a lighting requirement of the camera. CUP display panels in the prior art include a display region corresponding to a camera (abbreviated as: under-screen camera region) and standard display regions corresponding to a left side and a right side of the under-screen camera region. In order to improve a light transmittance of the under-screen camera region on the CUP display panel, in the prior art, a number of pixel driving circuits in the under-screen camera region configured to drive pixels in the under-screen camera region is less than a number of rows of the pixel driving circuits configured to drive pixels of standard display regions in the standard display regions. However, each row of pixel driving circuits in the standard display regions needs to be electrically connected to one signal line of a fixed signal type to receive electrical signals. The signal lines can extend to the under-screen camera region and can be electrically connected to the pixel driving circuits in the under-screen camera region. In this way, one row of pixel driving circuits in the under-screen camera region need to be electrically connected to a plurality of signal lines in the standard display regions. This wiring design manner can cause resistor-capacitor loading (RC loading) in the standard display regions and the under-screen camera region to be inconsistent, leading to horizontal cloud pattern (mura) generating on the display panel in low grayscale mode and generating an uneven display phenomenon.

SUMMARY OF INVENTION

In current display panels, horizontal cloud patterns appear in low grayscale mode, so there is a technical problem of uneven display.

The present invention provides a display panel and a display device, which eliminates a split-screen phenomenon between an under-screen camera region and general display regions to improve display effect of the under-screen camera region, while ensures a light transmittance of the under-screen camera region.

In order to solve the problems mentioned above, the present disclosure provides the technical solutions as follows:

The present invention provides a display panel, including: a display substrate including a first display region and a second display region adjacent to the first display region, wherein a light transmittance rate of the second display region is greater than a light transmittance rate of the first display region; n rows of first pixel driving circuits located in the first display region and m rows of second pixel driving circuits located in the second display region, a number the rows of the first pixel driving circuits is greater than a number of the rows of the second pixel driving circuits; a plurality of reset signal lines including n first reset signal lines corresponding to the n rows of the first pixel driving circuits; wherein one terminal of each of the first reset signal lines is electrically connected to the corresponding first pixel driving circuits, another terminal of one of any two adjacent first reset signal lines is electrically connected to the corresponding second pixel driving circuits, and other terminals of remaining first reset signal lines are disconnected from the second pixel driving circuits, and wherein m and n are integers.

In at least one embodiment of the present invention, an mth row of the second pixel driving circuits is connected to a 2*m−3th first reset signal line, and m is greater than or equal to 2.

In at least one embodiment of the present invention, an mth row of the second pixel driving circuits is connected to a 2*m−1th first reset signal line.

In at least one embodiment of the present invention, the plurality of reset signal lines include a plurality of second reset signal lines, and wherein two adjacent rows of the second pixel driving circuits in a part of the second pixel driving circuits are connected to one same second reset signal line.

In at least one embodiment of the present disclosure, m=n/2.

In at least one embodiment of the present disclosure, the display panel further includes n scanning signal lines, and wherein an nth scanning signal line correspond to an nth row of the first pixel driving circuits, the scanning signal lines corresponding to the first pixel driving circuits are connected to the second pixel driving circuits corresponding to the first pixel driving circuits, the nth scanning signal line is connected to an n−1th row of the pixel driving circuits, n is greater than or equal to 2, and 2*n−1th scanning signal line is connected to an n−1th row of the second pixel driving circuits.

In at least one embodiment of the present disclosure, the display panel further includes a camera corresponding to the second display region.

In at least one embodiment of the present disclosure, the plurality of second reset lines are closer to a central region of the second display region than the n first reset signal lines.

In at least one embodiment of the present disclosure, at least one of the second reset signal lines includes a first line and a second line connected to each other, the first line and the second line are connected to two rows of the second pixel driving circuits, and the first line and the second line are respectively located on two opposite sides of the central region.

In at least one embodiment of the present disclosure, the first pixel driving circuits or the second pixel driving circuits include a first transistor, a second transistor, a third transistor, a fourth transistor, a fifth transistor, a sixth transistor, a seventh transistor, and a capacitor, and all the first transistor, the second transistor, the third transistor, the fourth transistor, the fifth transistor, the sixth transistor, and the seventh transistor have a first terminal, a second terminal, and a gate electrode.

In at least one embodiment of the present disclosure, the first terminal and the second terminal are respectively a source electrode and a drain electrode; or the second terminal and the first terminal are respectively a source electrode and a drain electrode.

In at least one embodiment of the present disclosure, a first terminal of the first transistor is connected to a first terminal of the second transistor and a second terminal of the fifth transistor, a second terminal of the first transistor is connected to a second terminal of the third transistor and a first terminal of the sixth transistor, and a gate electrode of the first transistor is connected to a first terminal of the third transistor.

In at least one embodiment of the present disclosure, a second terminal of the second transistor is configured to receive a data signal, a gate electrode of the second transistor is configured to receive a scanning signal.

In at least one embodiment of the present disclosure, the second terminal of the third transistor is connected to the first terminal of the sixth transistor, a gate electrode of the third transistor is configured to receive the scanning signal, and a first terminal of the fourth transistor is connected to one terminal of the capacitor.

In at least one embodiment of the present disclosure, a second terminal of the fourth transistor is connected to a first terminal of the seventh transistor and is configured to receive a reset signal, and a gate electrode of the fourth transistor is configured to receive another scanning signal.

In at least one embodiment of the present disclosure, a first terminal of the fifth transistor is connected to another terminal of the capacitor and is configured to receive a power supply signal, and a gate electrode of the fifth transistor is connected to a gate electrode of the sixth transistor and is configured to receive an enable signal.

In at least one embodiment of the present disclosure, a second terminal of the sixth transistor is connected to a second terminal of the seventh transistor.

In at least one embodiment of the present disclosure, a gate electrode of the seventh transistor is configured to receive the scanning signal.

The present invention further provides a display device, including the display panel of any aforesaid embodiment.

The reset signal lines of the display panel provided by the present invention ensures the light transmittance of the under-screen camera region, and at the same time, the reset signal lines corresponding to the pixel driving circuits of the normal display region are disconnected every other line. Furthermore, the reset signal lines of the pixel driving circuits routed to the pixel driving circuits of a camera under screen are connected by two stepped connection methods, i.e., stepped forward and stepped backward. Under this connection structure, load (VI Loading) of the reset signal lines of the under-screen camera region and the normal display region does not change drastically, which eliminates the split-screen phenomenon between the under-screen camera region and the normal display region and improves display effect of the under-screen camera region.

DESCRIPTION OF DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only a part of the embodiments of the present disclosure, from which figures those skilled in the art can derive further figures without making any inventive efforts.

EMBODIMENTS OF INVENTION

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., are just refer to directions of the accompanying figures. Therefore, the used directional terms are for illustrating and understanding the present disclosure, but not for limiting the present disclosure. In the figures, units with similar structures are used same labels to indicate.

The present invention aim at current line connection current driving signals. As a number of driving circuits in an under-screen camera region is less than which in normal display regions, and connection methods in the prior art can cause difference of display brightness between the under-screen camera region and the normal display regions appears, which performs a significant split-screen phenomenon. Embodiments of the present invention can solve the defect.

Figure 1:
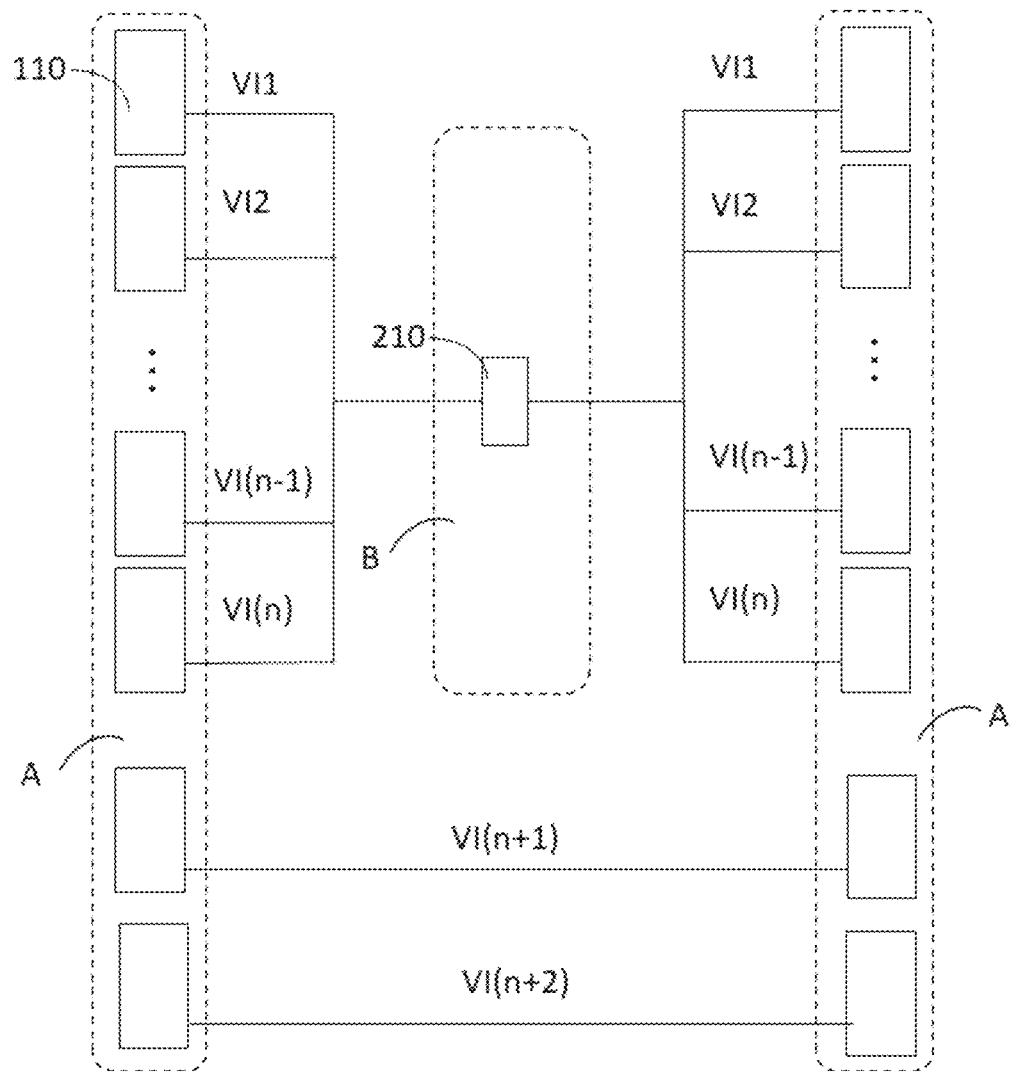
FIG. 1 is a schematic diagram of a display panel in the prior art.
Figure 2:
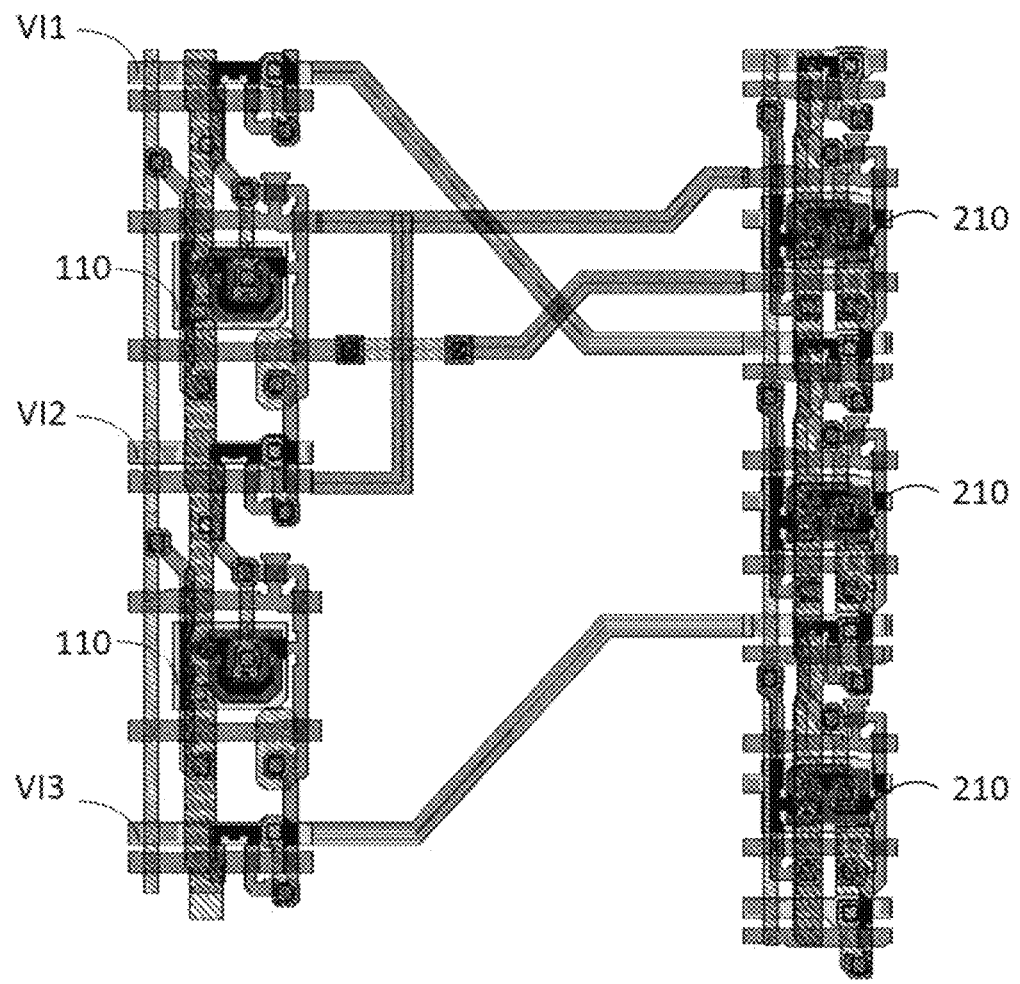
FIG. 2 is a schematic diagram of line connection of the display panel in the prior art.

As illustrated in FIG. 1 and FIG. 2, in the prior art, a plurality of normal pixel driving circuits 110 in a normal display region A are connected to pixel driving circuits 210 located near a camera under screen through a plurality of first reset signal lines VI1, VI2. In other words, each row of the pixel driving circuits 110 generally corresponds to one reset signal line. However, in a situation that the pixel driving circuits 110 are not specially designed, the pixel driving circuits may block light from passing through. Therefore, in order to increase a light transmittance of an under-screen camera region B, the pixel driving circuits of the under-screen camera region B is less than the pixel driving circuits of the normal display regions A. Therefore, adjacent reset signal lines (VI) in the normal display regions A are normally connected together, and then they are connected to the sub-pixel driving circuits in the under-screen camera B. This connection method can cause load of the first reset signal line to change drastically, resulting in a split-screen phenomenon. Therefore, a display panel is needed to overcome this technical problem.

Figure 3:
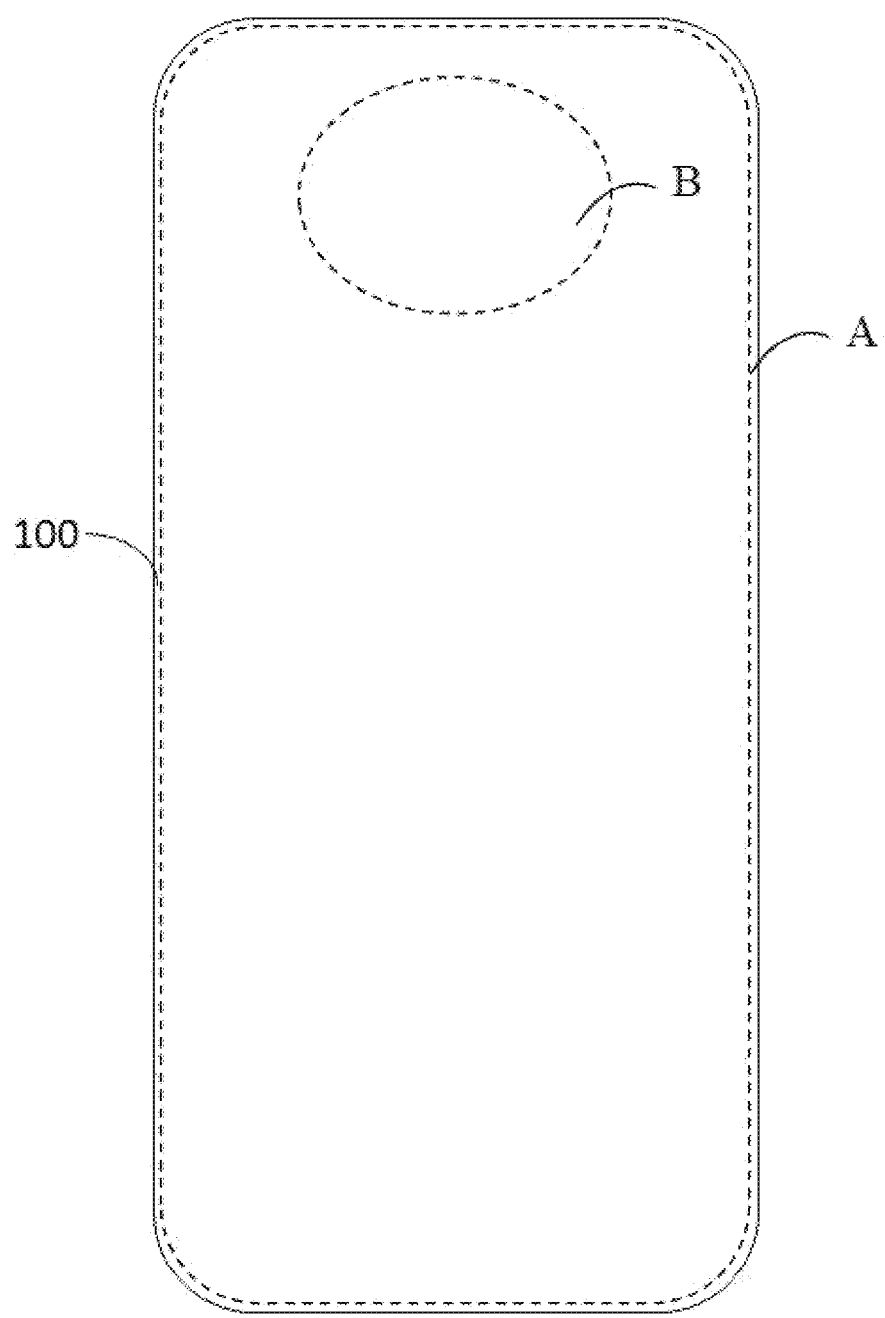
FIG. 3 is a schematic diagram of a display panel of the present invention.
Figure 4:
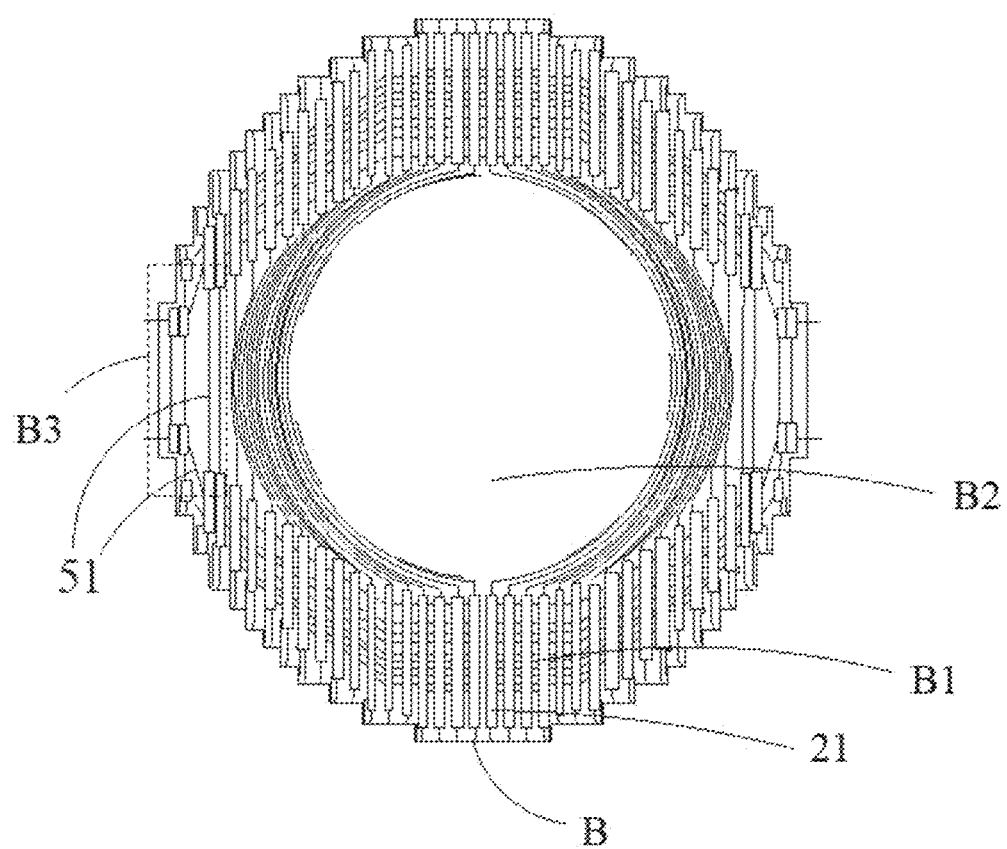
FIG. 4 is a schematic diagram of an under-screen camera region of the display panel of one embodiment of the present invention.

As illustrated in FIG. 3 and FIG. 4, the present invention provides a display panel 1, including a display substrate 100 including a first display region A and a second display region B adjacent to the first display region; and n rows of first pixel driving circuits 11 located in the first display region and m rows of second pixel driving circuits 21 located in the second display region. Wherein, a number the rows of the first pixel driving circuits is greater than a number of the rows of the second pixel driving circuits, and a plurality of reset signal lines VI1, VI2 . . . including n first reset signal lines corresponding to the first pixel driving circuits. Wherein, one terminal of each of the first reset signal lines is electrically connected to one row of the first pixel driving circuits 11, and another terminal of one of any two adjacent first reset signal lines is electrically connected to the corresponding second pixel driving circuits 21. Wherein, m and n are integers.

Wherein, the first display region A is a normal display region, the second display region B is the under-screen camera region.

A number the rows of the first pixel driving circuits 11 is greater than a number of the rows of the second pixel driving circuits 21, i.e., n>m. In FIG. 3, a first row and a second row of the first pixel driving circuits 11 correspond to a first row of the second pixel driving circuits 21, a third row and a fourth row of the first pixel driving circuits 11 correspond to a second row of the second pixel driving circuits 21 of the second pixel driving circuits 21 of a camera under screen, a fifth row and a sixth row of the first pixel driving circuits 11 correspond to a third row of the second pixel driving circuits 21, and so on, i.e., m=n/2.

Furthermore, as illustrated in FIG. 3 and FIG. 4. The second display region B includes a display transition region B1 and a light transmissive display region B2. The display transition region B1 is located on periphery of the light transmissive display region B2. Periphery of the display transition region B1 is the first display region A. A shape of the light transmissive display region B2 is circular or a structure similar to a circle. The display transition region B1 is a structure of a circular ring or similar to the circular ring. Sub-pixels are disposed in both the display transition region B1 and the light transmissive display region B2, which are provided to be driven by the second pixel driving circuits 21.

In other words, there is no pixel driving circuit in a central region of the under-screen camera region, and pixel driving circuits of sub-pixels in the under-screen camera region are all disposed around the under-screen camera region.

In the second display region B, the plurality of second pixel driving circuits 21 and various signal lines 51 are disposed in the display transition region B1 concentratedly. The signal lines 51 include data lines, reset signal lines, scanning lines, power supply lines, enable signal lines, etc., for example. Furthermore, there is no second pixel driving circuits 21 disposed in the light transmissive region B2. Transparent wirings (not shown in the figure) electrically connected to the second pixel driving circuits can be disposed in the light transmissive display region B2. Because there is no second pixel driving circuit 21 disposed in the second pixel driving circuits B2, the light transmittance rate of the light transmissive display region B2 can be further increased, and light sensing quality of light sensing elements can be improved.

Figure 5:
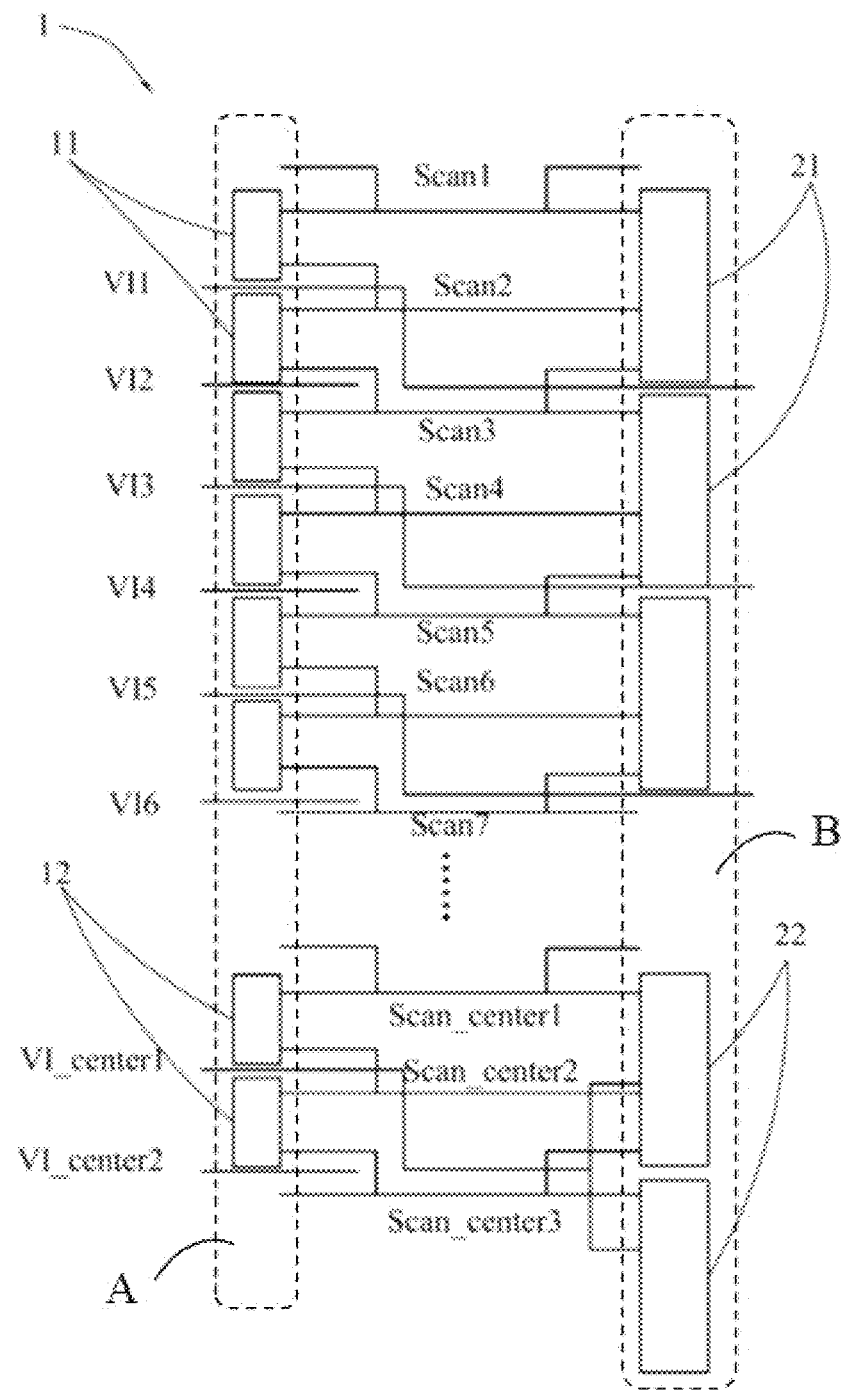
FIG. 5 is a schematic diagram of the display panel of one embodiment of the present invention.
Figure 6:
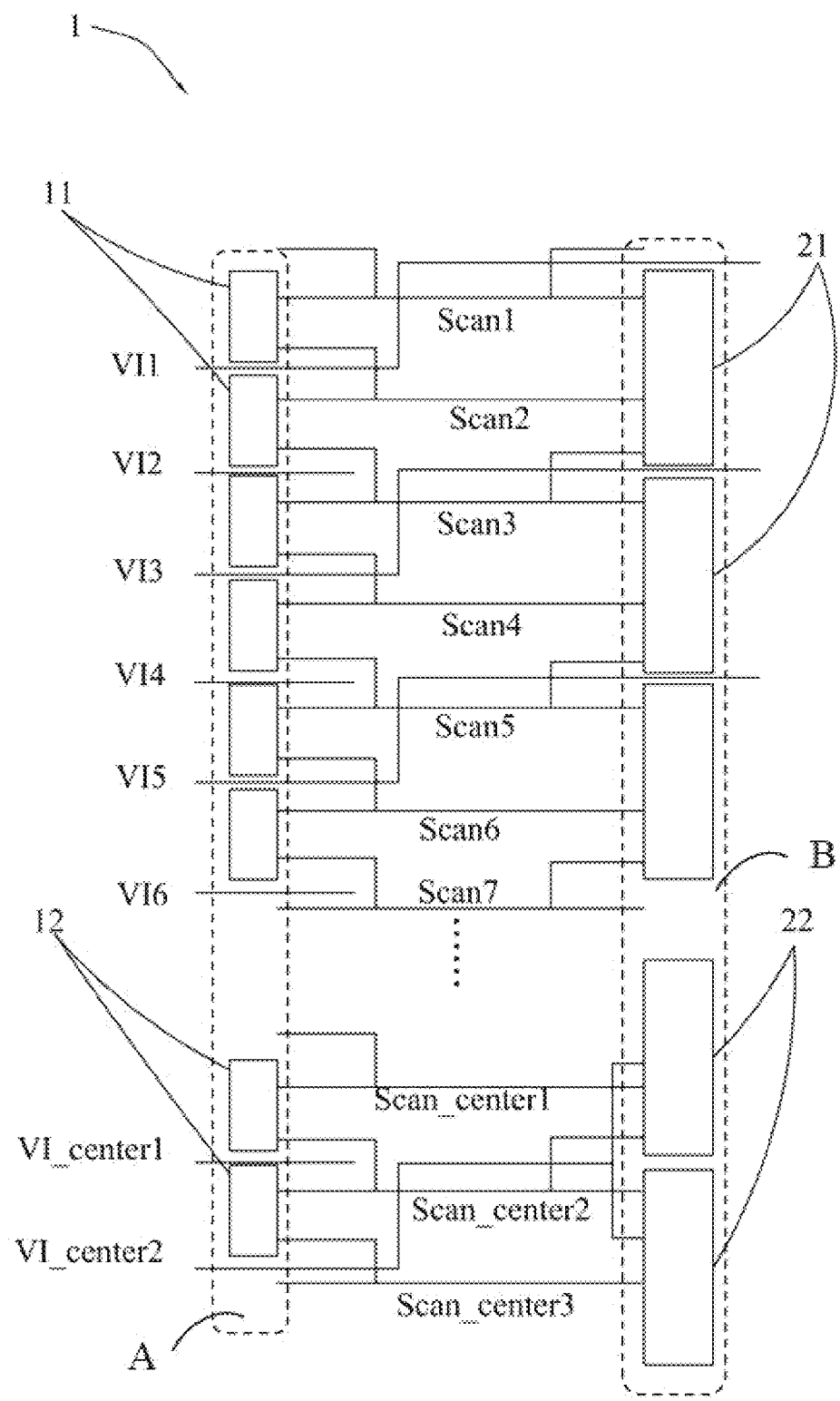
FIG. 6 is a first schematic diagram of the display panel of another embodiment of the present invention.
Figure 7:
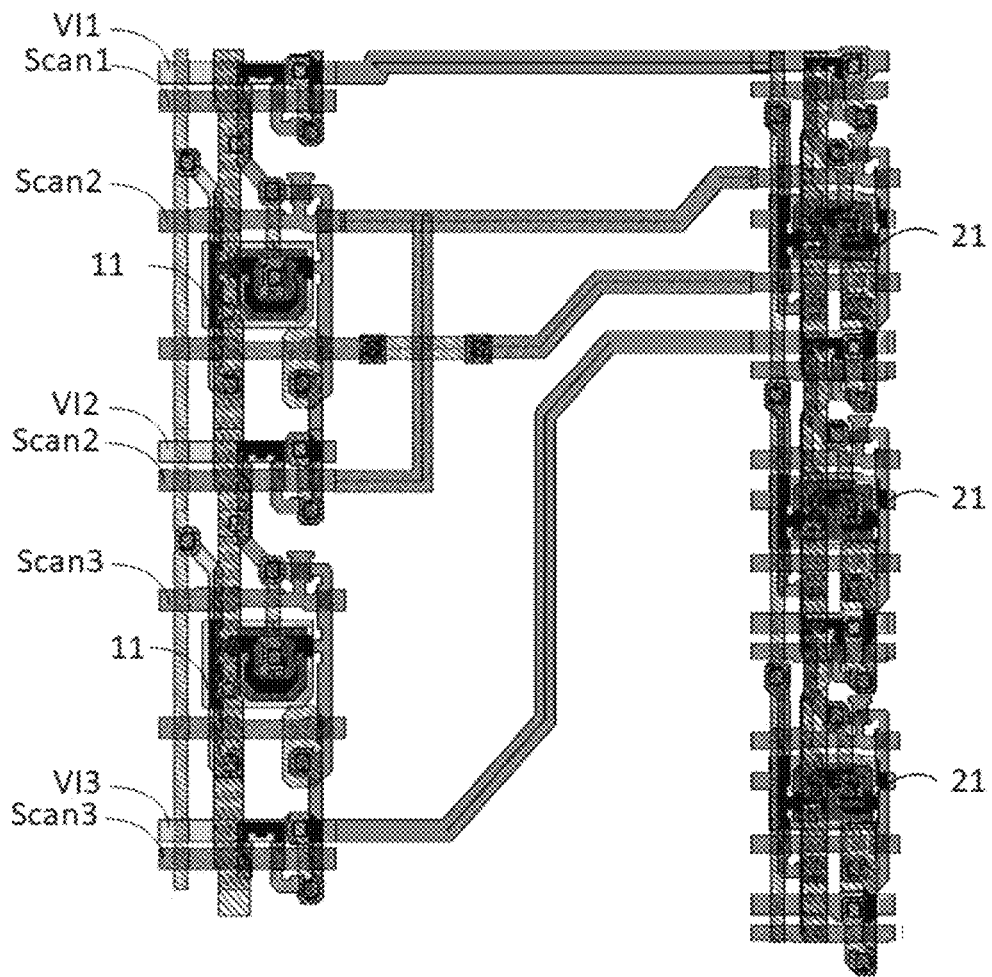
FIG. 7 is a second schematic diagram of the display panel of another embodiment of the present invention.

Furthermore, as illustrated in FIG. 5 to FIG. 7, because the number of the rows of the first pixel driving circuits 11 of the first display region A is greater than the number of the rows of the second pixel driving circuits 21 of the second display region B, the first reset signal line VI corresponding to the first pixel driving circuits 11 cannot all be connected to the second pixel driving circuits 21. Therefore, in FIG. 5 and FIG. 6, a 1st first reset signal line VI1, a 3rd first reset signal line VI3, and a 5th first reset signal line VI5 are connected to the second driving circuits 21, and a 2nd first reset signal line VI2, a 4th first reset signal line VI4, and a 6th first reset signal line VI6 are not connected to the second driving circuits 21, i.e., a connection structure of disconnected every other line is used. However, the disconnected first reset signal lines VI are not limited to first reset signal lines VI of even numbers, but the first reset signal lines VI of odd numbers can also be selected to be disconnected. In other words, the 1 st first reset signal line VI1, the 3rd first reset signal line VI3, and the 5th first reset signal line VI5 are not connected to the second driving circuits 21, but the 2nd first reset signal line VI2, the 4th first reset signal line VI4, and the 6th first reset signal line VI6 are connected to the second driving circuits 21, which are not limited by the present invention.

In the first reset signal line VI corresponding to the first pixel driving circuits 11, the one routed to the second pixel driving circuit 21 is connected to the first reset signal line. As illustrated in FIG. 5, each second pixel driving circuit 21 has an upper terminal (first terminal) and a lower terminal (second terminal), and the first reset signal lines can be connected to the first terminal or the second terminal of the second pixel driving circuits 21. Specifically, in FIG. 5, the first terminal of the first row of the second pixel driving circuits 21 is connected to the first terminal of the first reset signal line VI1, the second terminal of the first row of the second pixel driving circuits 21 is connected to the second terminal of the first reset signal line VI2, the second terminal of the second row of the second pixel driving circuits 21 is connected to the third row of the first reset signal lines, and the second terminal of the third row of the second pixel driving circuits 21 is connected to a fourth row of the first reset signal lines.

In this embodiment, an mth row of the second pixel driving circuits is connected to a 2*m−3th first reset signal line, and m is greater than or equal to 2. Specifically, as illustrated in FIG. 5, a second row of the second pixel driving circuits is connected to a 1st first reset signal line VI1, a third row of the second pixel driving circuits is connected to a 3rd first reset signal line VI3, a fourth row of the second pixel driving circuits is connected to a 5th first reset signal line VI5, and as so on, i.e., the second pixel driving circuits and the first reset signal lines are connected in a stepped forward structure.

A region B3 in FIG. 3 can be the central region of the display panel 1 of the present invention. The plurality of reset signal lines further includes a plurality of second reset signal lines VI_center1, VI_center2. Wherein, in the central region, two adjacent rows of the second pixel driving circuits in a part of the second pixel driving circuits are connected to one same second reset signal line, at least one of the second reset signal lines VI_center1, VI_center2 includes a first line and a second line connected to each other, the first line and the second line are connected to two rows of the second pixel driving circuits, and the first line and the second line are respectively located on two opposite sides of the central region. When one second reset signal line VI_center is routed to a central pixel driving circuit 12, it is divided into two signal lines and is connected two rows of pixel driving circuits of the camera under screen.

The display panel 1 of the present invention further includes n scanning signal lines Scan1, Scan2, . . . . Wherein, an nth scanning signal line correspond to an nth row of the first pixel driving circuits, the scanning signal lines Scan corresponding to the first pixel driving circuits 11 are connected to the second pixel driving circuits 21 corresponding to the first pixel driving circuits 11. As mentioned above, the first row and the second row of the first pixel driving circuits 11 correspond to the first row of the second pixel driving circuits 21, the third row and the fourth row of the first pixel driving circuits 11 correspond to the second row of the second pixel driving circuits 21, and so on. Therefore, the first and the second scanning signal lines Scan1, Scan2 respectively corresponding to the first row and the second row of the first pixel driving circuits 11 are connected to the first row of the second pixel driving circuit 21, and the third and the fourth scanning signal lines Scan3, Scan4 respectively corresponding to the third row and the fourth row of the first pixel driving circuits 11 are connected to the second row of the second pixel driving circuit 21.

The scanning signal lines Scan are not only connected to the second pixel driving circuits and are also connected to the first pixel driving circuits 11 of a previous stage, i.e., the nth scanning signal lines can be further connected to n−1th row of the first pixel driving circuit, and n is greater than or equal to 2. Moreover, the scanning signal lines Scan connected to the second pixel driving circuits 21 are selectively connected to the second pixel driving circuit 21 of previous stage, i.e., 2*n−1th scanning signal line is further connected to the n−1th row of the second pixel driving circuits. Specifically, as illustrated in FIG. 3, the third scanning signal line Scan3 is further connected to the first row of the second pixel driving circuits 21, the fifth scanning signal line Scan5 is further connected to the second row of the second pixel driving circuits 21, the seventh scanning signal line Scan7 is further connected to the third row of the second pixel driving circuits 21, and so on.

FIG. 6 to FIG. 7 are schematic diagrams of the display panel 1 of another embodiment of the present invention. The difference between FIG. 6 to FIG. 7 and FIG. 5 is that a stepped backward connection structure of the second pixel driving circuits and the first reset signal lines, i.e., the mth row of the second pixel driving circuits is connected an 2*m−1th first reset signal line. Specifically, as illustrated in FIG. 6 to FIG. 7, the first row of the second pixel driving circuits is connected to the 1st first reset signal line VI1, the second row of the second pixel driving circuits is connected to the 3rd first reset signal line VI3, the third row of the second pixel driving circuits is connected to the 5th first reset signal line VI5, and so on.

In the aforesaid embodiments, the first reset signal lines VI are reset signal lines, the second reset signal lines VI_center are reset signal lines of the central regions, and the scanning signal lines SCAN are scanning signal lines. Stepped connection and connection of every other line are used on the reset signal lines of the display panel 1 of the present invention, load (VI Loading) of the reset signal lines of the under-screen camera region and the normal display region does not change drastically, which eliminates the split-screen phenomenon between the under-screen camera region and the normal display region and improves display effect of the under-screen camera region.

Figure 8:
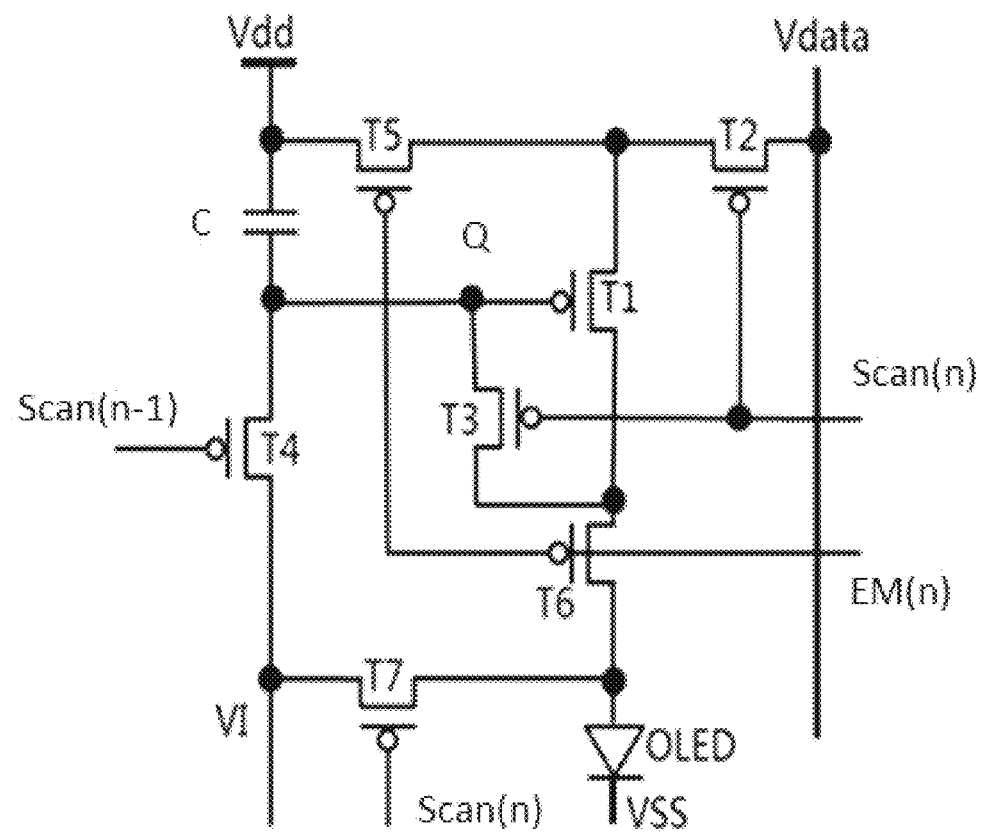
FIG. 8 is a schematic diagram of a pixel driving circuit of one embodiment of the present invention.

As illustrated in FIG. 8, the pixel driving circuits of the present invention can include seven transistors and one capacitor, which are a first transistor T1, a second transistor T2, a third transistor T3, a fourth transistor T4, a fifth transistor T5, a sixth transistor T6, a seventh transistor T7, and a capacitor C. Wherein, each thin film transistor includes a gate electrode, a source electrode, and a drain electrode. According to a type of each transistor, the source electrode and the drain electrode can respectively be the first terminal and the second terminal, or the source electrode and the drain electrode can respectively be the second terminal and the first terminal.

Furthermore, the first terminal of the first transistor T1 is connected to the first terminal of the second transistor T2 and the second terminal of the fifth transistor T5, the second terminal of the first transistor T1 is connected to the second terminal of the third transistor T3 and the first terminal of the sixth transistor T6, and the gate electrode of the first transistor T1 is connected to a node Q.

The second terminal of the second transistor T2 is configured to receive a data signal Vdata, the gate electrode of the second transistor T2 is configured to receive a scanning signal Scan(n).

The first terminal of the third transistor T3 is connected to the node Q, the second terminal of the third transistor T3 is connected to the first terminal of the sixth transistor T6, and the gate electrode of the third transistor T3 is configured to receive the scanning signal Scan(n).

The first terminal of the fourth transistor T4 is connected to one terminal of the capacitor C. The second terminal of the fourth transistor T4 is connected to the first terminal of the seventh transistor T7 and is configured to receive a reset signal VI. Wherein, the reset signal VI is transmitted by the aforesaid reset signal lines. The gate electrode of the fourth transistor T4 is configured to receive a scanning signal Scan(n−1).

The first terminal of the fifth transistor T5 is connected to another terminal of the capacitor C and is configured to receive a power supply signal Vdd, and the gate electrode of the fifth transistor T5 is connected to the gate electrode of the sixth transistor T6 and is configured to receive an enable signal EM(n).

The second terminal of the sixth transistor T6 is connected to the second terminal of the seventh transistor and the first pixel driving circuits 11 or the second pixel driving circuits 21, and wherein the first pixel driving circuits 11 or the second pixel driving circuits 21 can be organic light emitting diodes (OLEDs).

The gate electrode of the seventh transistor is configured to receive the scanning signal Scan(n).

In one embodiment, the pixel driving circuits are controlled by the scanning signal Scan(n−1), the scanning signal Scan(n), and one enable signal EM(n). The fourth transistor T4 in the first pixel driving circuit of this row is controlled by the scanning signal Scan(n−1), and the second transistor T2, the third transistor T3, and the seventh transistor T7 in the pixel driving circuits are controlled by the scanning signal Scan(n). The sixth transistor T6 is controlled by the enable signal EM.

The present application further provides a display device, which can be a terminal having a display function. The display device can be a fixed terminal such as a television, a desktop computer; a mobile terminal such as a smart phone; or a wearable terminal such as a smart watch. The display device can include the display panel of any aforesaid embodiment.

Beneficial effect: the reset signal lines of the display panel 1 provided by the present invention ensures the light transmittance of the under-screen camera region, and at the same time, the reset signal lines corresponding to the pixel driving circuits 11 are disconnected every other line; furthermore, the reset signal lines routed to the second pixel driving circuits 21 are connected by two stepped connection methods, i.e., stepped forward and stepped backward. Under this connection structure, load (VI Loading) of the reset signal lines of the under-screen camera region and the normal display region does not change drastically, which eliminates the split-screen phenomenon between the under-screen camera region and the normal display region and improves display effect of the under-screen camera region.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A display panel, comprising:
   a display substrate comprising a first display region and a second display region adjacent to the first display region, wherein a light transmittance rate of the second display region is greater than a light transmittance rate of the first display region;
   a plurality of rows of first pixel driving circuits located in the first display region and a plurality of rows of second pixel driving circuits located in the second display region, wherein a number of the rows of the first pixel driving circuits is greater than a number of the rows of the second pixel driving circuits; and
   a plurality of reset signal lines comprising a plurality of first reset signal lines,
   wherein a number of the plurality of first reset signal lines is equal to the number of the rows of the first pixel driving circuits, each of the plurality of first reset signal lines is arranged corresponding to one row of the first pixel driving circuits, and each of the plurality of first reset signal lines is electrically connected to a corresponding one row of the first pixel driving circuits;
   each row of the second pixel driving circuits are electrically connected to one of the plurality of reset signal lines, one of two adjacent ones of the plurality of first reset signal lines is electrically connected to one row of the second pixel driving circuits, and the other one of the two adjacent ones of the plurality of first reset signal lines is disconnected from the second pixel driving circuits.

2. The display panel as claimed in claim 1, wherein an m-th row of the second pixel driving circuits are connected to a (2m−3)-th one of the plurality of first reset signal lines, where m is an integer greater than or equal to 2.

3. The display panel as claimed in claim 1, wherein an m-th row of the second pixel driving circuits are connected to a (2m−1)-th one of the plurality of first reset signal lines, where m is an integer.

4. The display panel as claimed in claim 1, wherein the plurality of reset signal lines further comprise a plurality of second reset signal lines, and two adjacent rows of the second pixel driving circuits in a part of the second pixel driving circuits are connected to a same one of the plurality of second reset signal lines.

5. The display panel as claimed in claim 1, wherein the number of the rows of the first pixel driving circuits is twice the number of the rows of the second pixel driving circuits.

6. The display panel as claimed in claim 1, wherein the display panel comprises a plurality of scanning signal lines, an n-th one of the plurality of scanning signal lines corresponds to an n-th row of the first pixel driving circuits, the scanning signal lines corresponding to the first pixel driving circuits are connected to the second pixel driving circuits corresponding to the first pixel driving circuits, the n-th one of the plurality of scanning signal lines is connected to an (n−1)-th row of the first pixel driving circuits, where n is an integer greater than or equal to 2, and a (2n−1)-th one of the plurality of scanning signal lines is connected to an (n−1)-th row of the second pixel driving circuits.

7. The display panel as claimed in claim 1, wherein the display panel comprises a camera corresponding to the second display region.

8. The display panel as claimed in claim 4, wherein the plurality of second reset signal lines are closer to a central region of the second display region than the plurality of first reset signal lines.

9. The display panel as claimed in claim 4, wherein at least one of the plurality of second reset signal lines comprises a first line and a second line connected to each other, the first line and the second line are connected to two rows of the second pixel driving circuits, and the first line and the second line are respectively located on two opposite sides of a central region of the display panel.

10. The display panel as claimed in claim 1, wherein each of the first pixel driving circuits or each of the second pixel driving circuits comprises a first transistor, a second transistor, a third transistor, a fourth transistor, a fifth transistor, a sixth transistor, a seventh transistor, and a capacitor, and each of the first transistor, the second transistor, the third transistor, the fourth transistor, the fifth transistor, the sixth transistor, and the seventh transistor have a first terminal, a second terminal, and a gate electrode.

11. The display panel as claimed in claim 10, wherein the first terminal and the second terminal are respectively a source electrode and a drain electrode; or the second terminal and the first terminal are respectively a source electrode and a drain electrode.

12. The display panel as claimed in claim 11, wherein a first terminal of the first transistor is connected to a first terminal of the second transistor and a second terminal of the fifth transistor, a second terminal of the first transistor is connected to a second terminal of the third transistor and a first terminal of the sixth transistor, and a gate electrode of the first transistor is connected to a first terminal of the third transistor.

13. The display panel as claimed in claim 12, wherein a second terminal of the second transistor is configured to receive a data signal, a gate electrode of the second transistor is configured to receive a scanning signal.

14. The display panel as claimed in claim 13, wherein the second terminal of the third transistor is connected to the first terminal of the sixth transistor, a gate electrode of the third transistor is configured to receive the scanning signal, and a first terminal of the fourth transistor is connected to one terminal of the capacitor.

15. The display panel as claimed in claim 14, wherein a second terminal of the fourth transistor is connected to a first terminal of the seventh transistor and is configured to receive a reset signal, and a gate electrode of the fourth transistor is configured to receive another scanning signal.

16. The display panel as claimed in claim 15, wherein a first terminal of the fifth transistor is connected to another terminal of the capacitor and is configured to receive a power supply signal, and a gate electrode of the fifth transistor is connected to a gate electrode of the sixth transistor and is configured to receive an enable signal.

17. The display panel as claimed in claim 16, wherein a second terminal of the sixth transistor is connected to a second terminal of the seventh transistor.

18. The display panel as claimed in claim 17, wherein a gate electrode of the seventh transistor is configured to receive the scanning signal.

19. A display device, comprising a display panel, wherein the display panel comprises:
- a display substrate comprising a first display region and a second display region adjacent to the first display region, wherein a light transmittance rate of the second display region is greater than a light transmittance rate of the first display region;
- a plurality of rows of first pixel driving circuits located in the first display region and a plurality of rows of second pixel driving circuits located in the second display region, wherein a number the rows of the first pixel driving circuits is greater than a number of the rows of the second pixel driving circuits; and
- a plurality of reset signal lines comprising a plurality of first reset signal lines,
- wherein each of the plurality of first reset signal lines is arranged corresponding to one row of the first pixel driving circuits, and each of the plurality of first reset signal lines is electrically connected to a corresponding one row of the first pixel driving circuits;
- each row of the second pixel driving circuits are electrically connected to one of the plurality of reset signal lines, one of two adjacent ones of the plurality of first reset signal lines is electrically connected to one row of the second pixel driving circuits, and the other one of the two adjacent ones of the plurality of first reset signal lines is disconnected from the second pixel driving circuits.

20. The display device as claimed in claim 19, wherein an m-th row of the second pixel driving circuits are connected to a (2m−3)-th one of the plurality of first reset signal lines, where m is an integer greater than or equal to 2; or
the m-th row of the second pixel driving circuits are connected to a (2m−1)-th one of the plurality of first reset signal lines.

* * * * *